ELECTROLUMINESCENT CELL COMPRISING ZINC-DOPED GALLIUM ARSENIDE ON ONE SURFACE OF A SILICON NITRIDE LAYER AND SPACED CHROMIUM-GOLD ELECTRODES ON THE OTHER SURFACE

Filed Aug. 10, 1966

INVENTOR
C. N. BERGLUND
BY H W Lockhart
ATTORNEY

ELECTROLUMINESCENT CELL COMPRISING ZINC-DOPED GALLIUM ARSENIDE ON ONE SURFACE OF A SILICON NITRIDE LAYER AND SPACED CHROMIUM-GOLD ELECTRODES ON THE OTHER SURFACE

Filed Aug. 10, 1966

3,424,934

ELECTROLUMINESCENT CELL COMPRISING ZINC-DOPED GALLIUM ARSENIDE ON ONE SURFACE OF A SILICON NITRIDE LAYER AND SPACED CHROMIUM-GOLD ELECTRODES ON THE OTHER SURFACE

Carl N. Berglund, North Plainfield, N.J., assignor to Bell Telephone Laboratories, Inc., Berkeley Heights, N.J., a corporation of New York Filed Aug. 10, 1966, Ser. No. 571,555
U.S. Cl. 313—108 1 Claim
Int. Cl. H01j *63/04*

ABSTRACT OF THE DISCLOSURE

An electroluminescent semiconductor device adapted for the emission of light energy from the radiative recombination of minority carriers operates by the presentation of a cyclic electric displacement to the interface between a semiconductor body and a dielectric layer thereon. The device, a metal-insulator-semiconductor structure which does not include a PN junction, operates on a cyclic basis only and does not require any DC voltage or current. As presently understood, one portion of the cycle produces field-enhanced minority carrier charge storage adjacent the semiconductor-dielectric interface. During the opposite swing of the cycle the carriers associated with the stored charge diffuse and drift into the semiconductor bulk and recombine, thus emitting radiation.

This invention relates to a class of semiconductor devices which utilize a newly recognized phenomena. In particular this invention is concerned with devices which enable injection into a semiconductor body of charged particles without the use of a PN junction or other barrier layer. In greater particularity the invention involves semiconductor devices useful as emitters of light from the radiative recombination of carriers without the application of direct current power or the use of a barrier layer.

As is well known, the operation of a whole family of bipolar semiconductor devices turns upon the phenomenon of minority carrier injection. Thus it is the "injection" function of the emitter junction of the rectifier which provides the minority carrier current in the base region of the transistor and in the other conductivity type region of the diode, which enables their operation. In particular, in certain types of devices the injection of minority carriers into a conductivity type region provides the basis for carrier recombination which gives rise to useful radiation. Light emitting devices exhibiting this phenomenon by the use of PN junctions or other barrier layers are well known.

It will be appreciated, however, that both the step of fabricating and the inclusion of a PN junction in many types of semiconductor devices is disadvantageous. Of even greater moment, however, is the use of this invention with those semiconductors in which minority carrier injection has not heretofore been observed because of the inability to fabricate barrier layers therein. In this class are certain compound semiconductors of the II–VI group including, for example, cadmium sulfide, zinc sulfide, zinc oxide and zinc telluride. Also, barrier layer devices generally require rather high quality ohmic connections to enable the application of an adequate level of direct current power. Accordingly, light emitting devices in particular, may be improved by omitting the PN junction which permits reducing the thickness of the semiconductor body as well as the elimination of ohmic contacts. The paths for emitted light within the device are thereby enhanced.

In a broad aspect this invention is based on the recognition that the effect of minority carrier injection may be realized by the presentation of a time-varying electric displacement to the surface of a suitably doped semiconductor body. Such presentation is made, for example, by applying a cyclic electric potential to a suitable dielectric layer on the surface of a semiconductor body. In particular the potential may be applied by way of metal electrodes or plates on the surface of the dielectric layer. By a capacitive effect the cyclic potential applied at the dielectric layer induces a field in the adjoining semiconductor material during one portion of the cycle which tends to concentrate minority carriers near the interface between the semiconductor body and the dielectric layer. A suitably chosen dielectric, particularly from the standpoint of its dielectric constant and dielectric strength, and a suitably high voltage amplitude produces a field-enhanced minority carrier storage. When the direction of the applied potential is reversed at a particular rate the carriers associated with the charge thus stored are enabled to diffuse and drift into the semiconductor bulk, there to recombine with available majority carriers with a consequent emission of light energy.

Thus, in a particular embodiment in accordance with this invention, a light emitting or luminescent semiconductor device is provided utilizing a body of P type conductivity material having a thin inorganic dielectric layer of crystalline type on one surface thereof. A pair of contacts to the dielectric layer are connected through a resonant inductance to a radio frequency signal generator. Operation of the generator at frequencies in the range from about one to 100 megacycles results in observable light emission from the semiconductor body. Such emitted light is observed both from the surface opposite that of the dielectric coated surface as well as through the dielectric coating when the metal contact is of a semitransparent type or is replaced by a transparent conductor such as tin oxide. The emitted light has been distinguished from the light produced by the avalanche effect, and accordingly is independent of hitherto known modes of inducing light generation.

A more complete understanding of the invention may be had from the following detailed description set forth in conjunction with the drawing in which.

Figure 1:
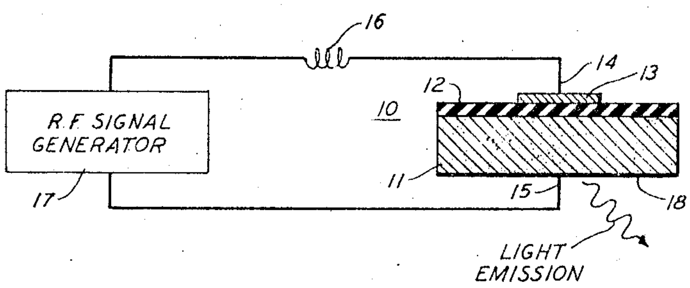
FIG. 1 is a schematic arrangement of an embodiment of the invention.
Figure 2:
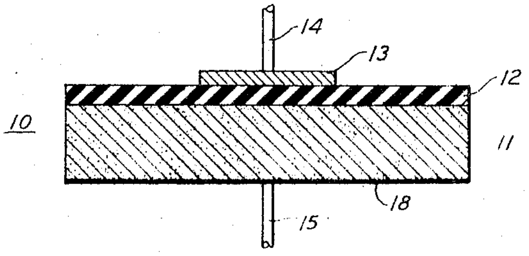
FIG. 2 is a cross sectional view of the semiconductor element in the embodiment of FIG. 1.

A basic embodiment of the invention is shown in the schematic diagram of FIG. 1. A semiconductor element 10 of the metal-insulator-semiconductor (MIS) type is connected in a circuit with a radio frequency generator 17 by way of a suitable inductor 16. Referring also to FIG. 2, the semiconductor element 10 comprises a semiconductor body 11 of P type gallium arsenide. In this particular embodiment the semiconductor material is monocrystalline and has an impurity content of zinc to provide a substantially uniform concentration of $4.2 \times 10^{18}$ atoms per cubic centimeter. On one major surface of the semiconductor body 11 is a dielectric coating 12 of silicon nitride having a thickness of about 1500 Angstroms. A small metal plate 13 of chromium covered by a layer of gold is formed on the surface of the dielectric layer 12.

In a specific embodiment the metal electrode is 15 mils in diameter and about 2500 Angstroms thick. Contacts 14 and 15 are applied to the metal electrode 13 and to ohmic contact 18 on the opposite surface of the semiconductor body 11. Techniques for the fabrication of the semiconductor element 10 are well known in the art. For example, the silicon nitride layer may be deposited from the pyrolytic reaction of ammonium and a silicon halide compound as disclosed, for example, in the application Ser. No. 541,-173 of A. A. Bergh and W. van Gelder, filed Apr. 8, 1966 or by the plasma deposition process disclosed in the application of J. R. Ligenza, Ser. No. 446,470, filed Mar. 29, 1965, both assigned to the same assignee as this application.

In the embodiment of FIG. 1 an alternating current voltage of approximately 80 volts peak-to-peak at a frequency of 16 megacycles is applied from the signal generator. The inductor 16 has a value of about one microhenry. Operation in this mode results in injection luminescence as indicated from the semiconductor body having a peak intensity at room temperature (25° C.) at a wavelength of about .88 micron.

An alternative to the chrome-gold electrode 13 comprises a thin, approximately 100 Angstroms layer of gold which has the advantage of being practically transparent. This type of electrode permits observation of the luminescence within the semiconductor body from the dielectric coated face of the element.

Figure 4:
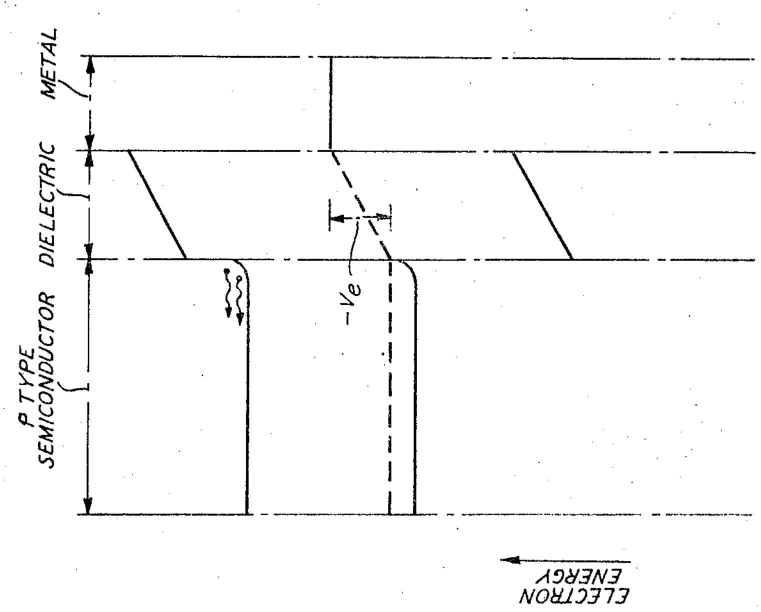
FIGS. 3 and 4 are energy band diagrams of the structure of the device in accordance with the invention under different bias conditions.
Figure 3:
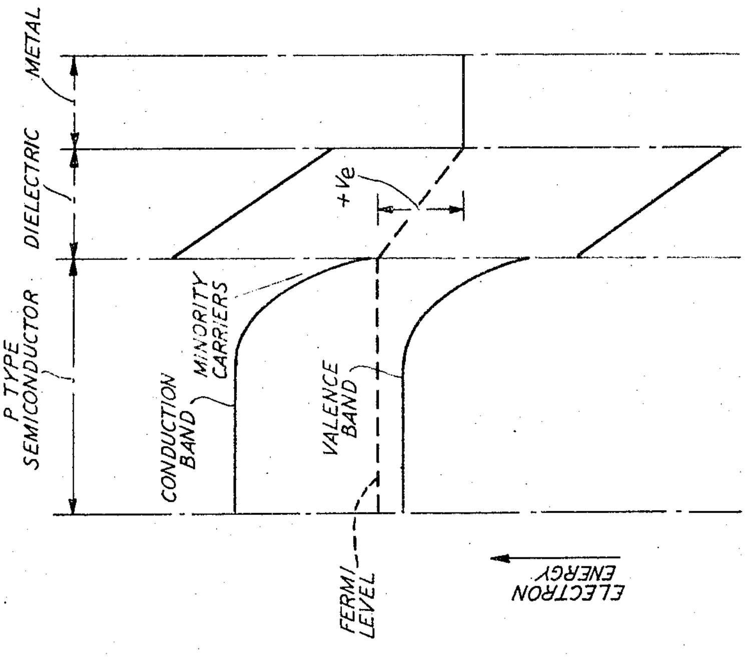

Referring to FIGS. 3 and 4 an explanation of the minority carrier injection in qualitative terms may be gained from the energy band diagram. FIG. 3 indicates the band structure at the peak positive value of applied voltage. In this condition the conduction and valence bands in the semiconductor are bent sharply downward as they approach the interface with the dielectric. During this condition minority carriers, in this case electrons, accumulate in the conduction band near the interface.

When the voltage is suddenly reversed in polarity as indicated by the diagram of FIG. 4 the bands in the semiconductor are raised near the semiconductor-dielectric interface and indeed may be curved slightly upward. During this condition the electrons accumulated during the positive portion of the cycle drift and diffuse into the semiconductor body and combinet with holes which now can move in the valence band closer to the interface. Thus a cyclic voltage applied to the plate electrode 13 of the MIS element 10 produces minority carriers on the positive half cycle and injects them into the bulk of the body on the negative half cycle, thus effecting a minority carrier injection.

The operation of the device as a minority carrier injector requires the production of a copious quantity of minority carriers in the space charge region during the positive half cycle of the voltage. In general this level of accumulation is provided either by avalanche multiplication or by the tunneling effect rather than by the normal thermal generation or diffusion from the bulk of the semiconductor body. Accordingly, the doping level in the semiconductor body, the character of the dielectric layer and the frequency of applied voltage are chosen to achieve the desired effect.

Figure 5:
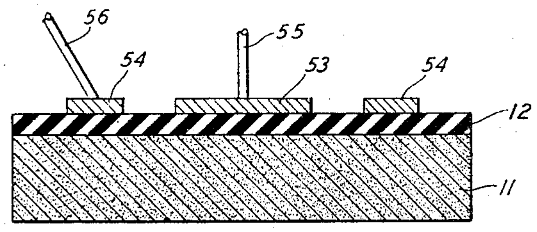
FIG. 5 is a cross sectional view of another form of semiconductor element in accordance with the invention.

It will be appreciated from the foregoing description that the device in accordance with this invention operates without any direct current flow. Accordingly, certain distinct structural advantages inhere in this type of device. In particular, electric contact to the semiconductor element is required only to the extent necessary to produce a time-varying potential drop and consequent field across the dielectric. An electrode arrangement as shown in the MIS element of FIG. 5 is particularly advantageous. This structure comprises a semiconductor body 11 and dielectric layer 12 as previously described. In addition to a centrally disposed metal electrode 53 with connecting lead 55, there is a second metal electrode 54 of annular form with connecting lead 56. The application of the cyclic potential, as described above, to the leads 55–56 produces the required time-varying electric displacement to the semiconductor surface. The device shown in FIG. 5 is fabricated facilely by a single, masked deposition of electrode metal on the dielectric surface.

A number of factors affect the efficiency of operation of the device described herein. The phenomena of minority carrier injection as a consequence of field-enhanced minority carrier charge storage depends upon the existence of an electric displacement at the semiconductor-dielectric interface. For purposes of this explanation peak displacement is the product of the dielectric constant of the layer 12 and the peak electric field in the layer. The maximum value of applied voltage is limited by breakdown voltage of the dielectric. The peak electric displacement is a measure of the maximum minority carrier density injected per cycle. Accordingly, it is advantageous to obtain the highest possible value of displacement.

For the device described herein, it can be shown, to a first approximation, that, $$j_{\text{ave}} = \epsilon[E_I - E_B] f \left(1 - e - \frac{1}{2f\tau}\right)$$

where:

$j_{\text{ave}}$ is the average minority carrier current;
$\epsilon$ is the dielectric constant of the layer 12;
$E_I$ and $E_B$ are, respectively, the peak electric field in the insulator and the electric field in the insulator at the threshold of avalanching or tunneling;
$f$ is the frequency of the applied potential; and
$\tau$ is the effective bulk minority carrier recombination time constant.

Generally, the optimum frequency at which to drive the device is near that corresponding to the reciprocal of the minority carrier recombination time, if the time required for avalanche multiplication or tunneling is suitably short.

As suggested by the foregoing equation, at lower frequencies, for a given voltage, the average minority carrier current is directly proportional to the frequency. As indicated by the exponential term there is a point at higher frequency at which the minority carriers produced during the one-half of the cycle do not have enough time to recombine or diffuse beyond the space charge boundary during the next half cycle. Generally for the embodiment described comprising gallium arsenide and silicon nitride a driving frequency in the range from one to 100 megacycles is effective.

In addition to gallium arsenide other semiconductors may be used including other III–V inter-metallic compounds of indium, gallium, arsenic and phosphorus as well as the elemental semiconductors germanium and silicon, and compounds of the II–VI type. Of significance in the selection of the semiconductor and more particularly the level of impurity doping provided therein, is the nature of the minority carrier generation process used. If a low doping level is provided, a higher voltage is required across the semiconductor space-charge region in order to produce avalanche breakdown, and thus a considerable amount of power is dissipated in the generation process. If the semiconductor is very heavily doped to enable tunneling, some minority carriers may tunnel back into the reformed space-charge region rather than recombine as desired. Accordingly, an ideal impurity concentration level will be one at which breakdown results approximately equally from both tunneling and avalanche multiplication. For example, for gallium arsenide this condition occurs at impurity concentration of about $2\times10^{18}$ centimeters $^{-3}$.

Figure 6:
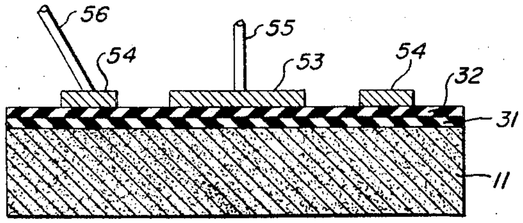
FIG. 6 is a cross-sectional view of another form of semiconductor element in which the dielectric layer comprises two insulating films.

The advantages of using an insulator having high displacement have already been suggested. It is also important that the physical structure of the dielectric be uniform and homogeneous, and in particular, free from pinholes which are conducive to localized breakdown. From the standpoint of displacement certain ferroelectric materials of the perovskite type such as potassium tantalate and barium titanate are useful. In connection with the physical structure of the dielectric layer a multiple layer, as shown in FIG. 6, using materials such as silicon oxide, silicon nitride, or tantalum oxide as a relatively thin initial layer 31 on the semiconductor with a thicker overlayer material 32 such as ferroelectric offers certain advantages. Such an arrangement is self-sealing and thus is more resistant to dielectric breakdown, and permits use of a higher dielectric constant overlayer enabling the inducement of higher displacements.

Within the limitations of the foregoing considerations regarding the character of the dielectric layer, its thickness may range from several thousand Angstroms to several microns. The nature of the driving source is one factor in choosing thickness, a thicker oxide providing a lower capacitance and higher impedance for the source requiring such a match.

Moreover, in many cases the insulator-semiconductor interface advantageously has a low density of surface states coupled with, or alternatively, a long surface-state time constant compared to the bulk recombination time constant ($\tau$) of the semiconductor. This is desirable if operaiton is to be a bulk effect for producing luminescence.

This invention has been described particularly in terms of minority carrier injection from a field-enhanced minority carrier charge storage effect. Thus, the structure described functions as an emitter and may find use in a variety of applications in place of previously known barrier layer emitters in addition to the specifically described light emitting function. For instance, the MIS minority carrier emitter described above may be used in place of the PN junction emitter of a transistor. Moreover, although the operation has been described in terms of minority carriers generated from within the semiconductor bulk it will be appreciated that similar operation may be achieved using ionized surface states with storage of the charge associated therewith as the medium of injection, as well as using certain deep lying impurity states within the semiconductor bulk.

Thus, it is consistent with the practice of this invention to use a semiconductor element which may be of one conductivity type, monocrystalline or polycrystalline coupled with a time-varying displacement means effective to produce minority carrier injection.

It will be apparent to those familiar with the current activity in light emitting devices that structures utilizing the phenomena disclosed herein may be arranged to produce coherent light as a result of stimulated emission. For these purposes it will be advantageous to arrange suitable geometry including mirrored surfaces as well as particular pumping frequencies adapted to produce such stimulated emission.

Although the invention has been described in terms of certain specific embodiments it will be understood that other arrangements may be devised by those skilled in the art which likewise fall within the scope and spirit of the invention.

What is claimed is:

1. Apparatus for the emission of light energy from the radiative recombination of minority carriers injected as a result of field-enhanced minority carrier storage comprising an electroluminescent cell including a body of semiconductor material of P-type gallium arsenide containing zinc as a doping impurity, a silicon nitride dielectric layer of about 1500 Angstroms thickness on at least a portion of said body, a pair of spaced apart electrical connections on said dielectric layer comprising a first centrally disposed chromium-gold electrode and a second chromium-gold electrode of annular form surrounding said first electrode, the cell being free of additional electrical connections thereto, and a source of alternating potential at a frequency of about sixteen megacycles coupled to said electrical connections so as to produce a time-varying electric displacement at the interface of the semiconductor body and the dielectric layer, said electric displacement being of magnitude such that light energy is emitted from said cell.

References Cited

UNITED STATES PATENTS

| | | |
|---|---|---|
| 1,745,175 | 1/1930 | Lilienfeld. |
| 3,121,177 | 2/1964 | Davis. |
| 3,175,116 | 3/1965 | Feuer. |
| 3,258,663 | 6/1966 | Weimer. |
| 3,267,317 | 8/1966 | Fischer. |
| 3,290,569 | 12/1966 | Weimer. |
| 3,293,512 | 12/1966 | Simmons et al. |

OTHER REFERENCES

Lindner, "Semiconductor Surface Varactor"; The Bell System Technical Journal for May 1962; volume XLI, No. 3, p. 803–831.

ROBERT SEGAL, *Primary Examiner.*

U.S. Cl. X.R.

307—311